(12) United States Patent
Clark et al.

(10) Patent No.: US 11,942,536 B2
(45) Date of Patent: Mar. 26, 2024

(54) SEMICONDUCTOR DEVICE HAVING CHANNEL STRUCTURE WITH 2D MATERIAL

(71) Applicant: Tokyo Electron Limited, Tokyo (JP)

(72) Inventors: Robert D. Clark, Albany, NY (US); H. Jim Fulford, Albany, NY (US); Mark I. Gardner, Albany, NY (US)

(73) Assignee: TOKYO ELECTRON LIMITED, Tokyo (JP)

( * ) Notice: Subject to any disclaimer, the term of this patent is extended or adjusted under 35 U.S.C. 154(b) by 70 days.

(21) Appl. No.: 17/671,304

(22) Filed: Feb. 14, 2022

(65) Prior Publication Data
US 2023/0261098 A1 Aug. 17, 2023

(51) Int. Cl.
| | | |
|---|---|---|
| *H01L 29/76* | (2006.01) | |
| *H01L 21/8256* | (2006.01) | |
| *H01L 27/092* | (2006.01) | |
| *H01L 29/66* | (2006.01) | |
| *H01L 29/786* | (2006.01) | |

(52) U.S. Cl.
CPC ...... *H01L 29/7606* (2013.01); *H01L 21/8256* (2013.01); *H01L 27/0922* (2013.01); *H01L 29/66969* (2013.01); *H01L 29/78642* (2013.01)

(58) Field of Classification Search
None
See application file for complete search history.

(56) References Cited

U.S. PATENT DOCUMENTS

| | | | |
|---|---|---|---|
| 9,024,376 B2 | 5/2015 | Masuoka et al. | |
| 9,425,324 B2 | 8/2016 | Diaz et al. | |
| 9,478,624 B2 | 10/2016 | Colinge et al. | |
| 2004/0262681 A1* | 12/2004 | Masuoka | H01L 29/78642 257/E21.415 |
| 2008/0173933 A1* | 7/2008 | Fukuzumi | H01L 29/7881 257/E29.302 |
| 2011/0121396 A1* | 5/2011 | Lee | G11C 11/403 257/E29.264 |
| 2013/0240983 A1* | 9/2013 | Larrieu | H01L 29/4232 257/329 |
| 2016/0141366 A1* | 5/2016 | Lai | H01L 29/7869 438/157 |
| 2016/0190343 A1* | 6/2016 | Hou | H01L 29/66742 438/161 |
| 2020/0066917 A1* | 2/2020 | Kula | H01L 29/78696 |

* cited by examiner

*Primary Examiner* — Bilkis Jahan
(74) *Attorney, Agent, or Firm* — FOLEY & LARDNER LLP

(57) ABSTRACT

Systems and methods for manufacturing two-dimensional (2D) gas channel for vertical transistors. The system can include a semiconductor device. The semiconductor device can include a channel structure surrounding a first dielectric core. The channel structure can include a first two-dimensional (2D) material and a second 2D material. The semiconductor device can include a source metal surrounding a first portion of the channel structure. The semiconductor device can include a drain metal surrounding a second portion of the channel structure. The semiconductor device can include a gate metal surrounding a third portion of the channel structure.

20 Claims, 11 Drawing Sheets

SEMICONDUCTOR DEVICE HAVING CHANNEL STRUCTURE WITH 2D MATERIAL

TECHNICAL FIELD

The present invention relates generally to the field of manufacturing semiconductor devices.

BACKGROUND

In the manufacture of semiconductor devices (especially on the microscopic scale), various fabrication processes are executed, such as film-forming depositions, etch mask creation, patterning, material etching and removal, and doping treatments. These processes are performed repeatedly to form desired semiconductor device elements on a substrate. In certain systems, microfabrication techniques manufacture transistors in one plane, while wiring or metallization is formed above the active device plane. Such devices are accordingly characterized as two-dimensional (2D) circuits, manufactured using 2D fabrication techniques.

SUMMARY

Three-dimensional (3D) integration, e.g., a stacking (or vertical arrangement) of multiple semiconductor devices (e.g., transistor structures), can overcome scaling limitations experienced in planar devices by increasing transistor density in volume rather than area. In a vertical field-effect transistor (VFET) or vertical transistor FET (VTFET), a stack of layers of devices can be constructed using one or more material deposition techniques. A collection of a drain, source, gate, and channel extending from at least the drain and the source can form the transistor. By stacking the drain, source, and gate vertically, the systems and methods can increase the density in volume rather than area. The vertical stack of layers of devices can form/construct a certain type of device, such as a vertical complementary FET (CFET). For example, a vertical CFET can be formed by stacking a p-type FET on top of an n-type FET (e.g., two opposing conductive types of transistors).

The systems and methods of the technical solution can form, structure, or construct a VFET with one or more 2D gas channels. The 2D gas channel can be formed at an interface between two or more 2D materials, such as lanthanum aluminate ($LaAlO_3$), strontium titanate ($SrTiO_3$), n-aluminum gallium arsenide (n-AlGaAs), i-gallium arsenide (i-GaAs), semi-gallium arsenide (SI—GaAs), graphene, transition metal dichalcogenides (TMDs), among others. The 2D materials can extend from the source to the drain of a transistor. For instance, the interface between two materials can be a semi-semi or dielectric-dielectric interface to enable high-performance VFET.

Based on the conductive type of the stacked FET, the 2D gas channel formed at an interface or a middle material of two or more 2D materials can correspond to a 2D electron gas (2DEG) (e.g., for n-type FET or NMOS) or a 2D hole gas (2DHG) (e.g., for p-type FET or PMOS). In some cases, the two or more materials can be epitaxially grown or amorphously grown. The 2DEG can be gated to provide high mobility. By forming the 2D gas channel between the 2D materials extending from the source metal to the drain metal, the systems and methods can enable a higher density circuit. Further, the systems and methods can enable the implementation of a higher dimension (e.g., thicker) of 2D materials while improving/enhancing transistor properties in VFET systems or applications.

At least one aspect of the present disclosure is directed to a semiconductor device for 2D gas channel for VFETs. The semiconductor device can include a channel structure surrounding a dielectric core. The channel structure can include a first two-dimensional (2D) material and a second 2D material. The semiconductor device can include source metal surrounding a first portion of the channel structure. The semiconductor device can include a drain metal surrounding a second portion of the channel structure. The semiconductor device can include a gate metal surrounding a third portion of the channel structure.

In some implementations, the channel structure can include a 2D gas formed at an interface between the first 2D material and the second 2D material. The 2D gas can extend from the first source metal to the first drain metal. In some cases, the channel structure can extend along a portion of a sidewall and a bottom surface of the dielectric core. In some implementations, the semiconductor device can include a high-k gate dielectric interposed between the third portion of the channel structure and the gate metal.

In some implementations, the semiconductor device can include a second channel structure surrounding a second dielectric core that is disposed above the first dielectric core. The second channel structure can include a third 2D material and a fourth 2D material. The semiconductor device can include a second source metal surrounding a first portion of the second channel structure. The semiconductor device can include a second drain metal surrounding a second portion of the second channel structure. The semiconductor device can include a second gate metal surrounding a third portion of the second channel structure.

In some cases, at least one of the third 2D material or the fourth 2D material may be different from at least one of the first 2D material or the second 2D material. In some cases, at least one of the third 2D material or the fourth 2D material may be the same material as at least one of the first 2D material or the second 2D material. In some implementations, the channel structure, the source metal, the drain metal, and the gate metal can collectively form a first transistor having a first conductive type. The second channel structure, the second source metal, the second drain metal, and the second gate metal can collectively form a second transistor having a second conductive type opposite to the first conductive type.

At least one other aspect of the present disclosure is directed to a semiconductor device for a 2D gas channel for VFETs. The semiconductor device can include a first transistor structure and a second transistor structure. The first transistor can include a first channel structure surrounding a first dielectric core in a channel opening. The first channel structure can include a first two-dimensional (2D) material and a second 2D material. The first transistor can include a first source metal surrounding a first portion of the first channel structure. The first transistor can include a first drain metal surrounding a second portion of the first channel structure. The first transistor a first gate metal surrounding a third portion of the first channel structure. The second transistor structure can be disposed above the first transistor. The second transistor can include a second channel structure surrounding a second dielectric core disposed above the first dielectric code in the channel opening. The second channel structure can include a third 2D material and a fourth 2D material. The second transistor can include a second source metal surrounding a first portion of the second channel structure. The second transistor can include a second drain metal surrounding a second portion of the second channel structure. The second transistor can include a second gate metal surrounding a third portion of the second channel structure.

In some implementations, the first channel structure can include a first 2D gas formed at an interface between the first 2D material and the second 2D material. The second channel structure can include a second 2D gas formed at an interface between the third 2D material and the fourth 2D material. In some implementations, the first 2D gas can extend from the first source metal to the first drain metal. The second 2D gas can extend along the vertical direction from the second source metal to the second drain metal.

In some implementations, the first channel structure can extend along a first portion of a sidewall and a bottom surface of the first dielectric core. In some cases, the second channel structure can extend along a second portion of the sidewall, a bottom surface of the second dielectric core, and a top surface of the first dielectric core. In some implementations, the semiconductor device can include a first high-k gate dielectric interposed between the third portion of the first channel structure and the first gate metal.

At least one other aspect of the present disclosure is directed to a method for a 2D gas channel for VFETs. The method can include forming a stack of layers including a first metal layer, a second metal layer, and a third metal layer that are isolated from one another with at least one dielectric material. The method can include forming a channel opening through the stack. The method can include lining at least inner sidewalls of the channel opening with a first two-dimensional (2D) material and a second 2D material The first 2D material can be coupled to respective inner sidewalls of the first metal layer, the second metal layer, and the third metal layer.

In some implementations, the method can include depositing a first dielectric core that extends in the channel opening lined with the first 2D material and the second 2D material. In some cases, each of the first metal layer, the second metal layer, and the third metal layer can correspond to one of a source metal, a drain metal, or a gate metal. In some implementations, the method can include forming a high-k gate dielectric interposed between one of the first 2D material or the second 2D material and the gate metal. In some implementations, the method can include forming a first 2D gas at an interface between the first 2D material and the second 2D material.

These and other aspects and implementations are discussed in detail below. The foregoing information and the following detailed description include illustrative examples of various aspects and implementations, and provide an overview or framework for understanding the nature and character of the claimed aspects and implementations. The drawings provide illustration and a further understanding of the various aspects and implementations, and are incorporated in and constitute a part of this specification. Aspects can be combined and it will be readily appreciated that features described in the context of one aspect of the invention can be combined with other aspects. Aspects can be implemented in any convenient form. As used in the specification and in the claims, the singular form of 'a', 'an', and 'the' include plural referents unless the context clearly dictates otherwise.

BRIEF DESCRIPTION OF THE DRAWINGS

Non-limiting embodiments of the present disclosure are described by way of example with reference to the accompanying figures, which are schematic and are not intended to be drawn to scale. Unless indicated as representing the background art, the figures represent aspects of the disclosure. For purposes of clarity, not every component may be labeled in every drawing. In the drawings.

DETAILED DESCRIPTION

Figure 1:
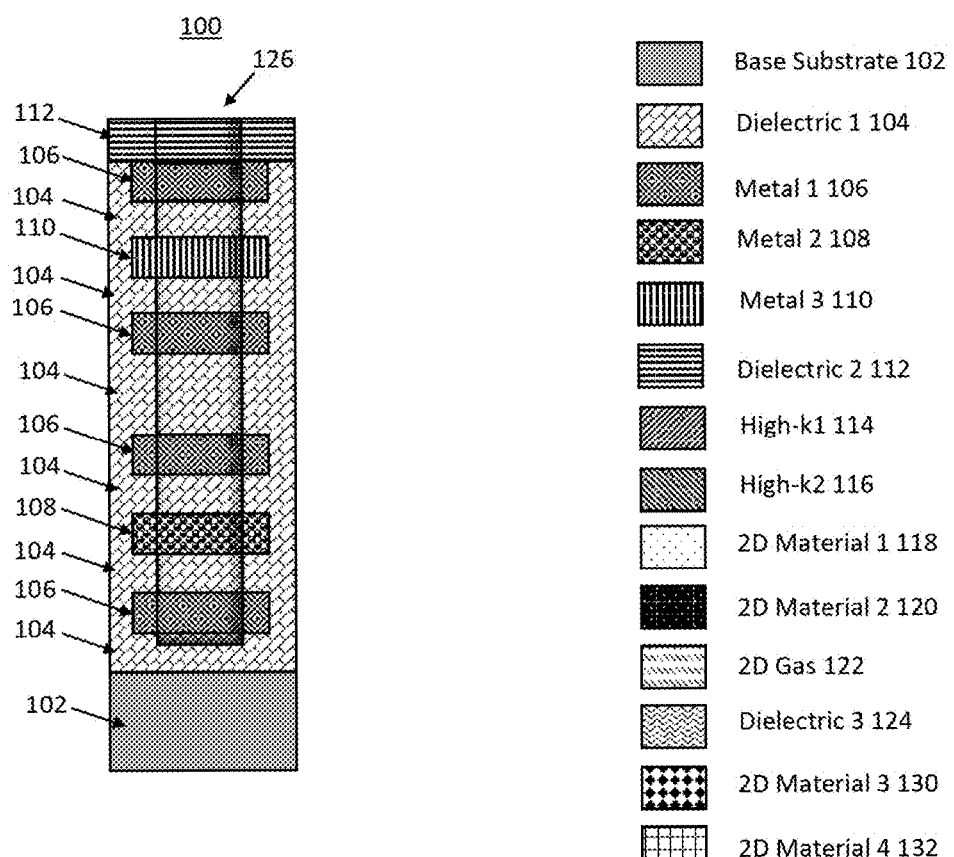
FIGS. 1-8 illustrate cross-sectional views of a process flow to form 2D gas channels for a device, according to an embodiment.

Reference will now be made to the illustrative embodiments depicted in the drawings, and specific language will be used here to describe the same. It will nevertheless be understood that no limitation of the scope of the claims or this disclosure is thereby intended. Alterations and further modifications of the inventive features illustrated herein, and additional applications of the principles of the subject matter illustrated herein, which would occur to one skilled in the relevant art and having possession of this disclosure, are to be considered within the scope of the subject matter disclosed herein. Other embodiments may be used and/or other changes may be made without departing from the spirit or scope of the present disclosure. The illustrative embodiments described in the detailed description are not meant to be limiting of the subject matter presented.

This application relates to vertically oriented transistor devices and their methods of manufacture. More specifically, described herein are structures in which the current between the drain and source is primarily in the direction normal to the surface of the die, e.g., vertical field-effect transistor (VFET) and Complementary Field Effect Transistor (CFET) structures.

Electronic devices (e.g., transistors) are conventionally formed in horizontal planar configurations. However, limitations on the amount of area and required density of devices in a given footprint increasingly necessitate the use of novel structures. The present application provides devices that can be oriented in a vertical direction, such that current flows in the vertical or z-direction allowing arrays of transistors to be stacked relative to the primary planar surface of the array or underlying substrate. Further, the devices, as disclosed herein, can each include two or more 2D materials extending to form a quantum well, which allows 2D electrode or hole gas to be formed therein. The electron or hole flow of respective devices can be improved/enhanced with the implementation of the 2D materials extended between the source and drain, for example.

According to the techniques described, 3D VFET devices may be created on any suitable substrate including conductive, semiconductive, or dielectric substrates. The underlying substrate may be a passive structure such as a handle wafer or passive interposer, or may have active devices, such as memory devices, circuitry, etc. Advantageously, VFETS may be provided above other active devices allowing for close proximity between devices. The VFETs may also be stacked as all one conductivity type, e.g., N-type or P-type or the conductivity type may be combined, such one or more N-type devices over or under one or more P-type devices in the stack. Such configurations may include, but are not limited to so-called CFETs, e.g., complementary Field Effect Transistors. CFET structures may include a gate-all-around (GAA) structure.

According to certain implementations, one or more transistor structures are formed by stacking layers to form a source (or drain), gate, and drain (or source) separated by one or more dielectric layers to isolate each portion of the transistor. The channel may be oriented in a z-direction, i.e., perpendicular to the direction that the layers are stacked. A high k dielectric material may be provided between the gate and the channel as will be described more fully below. A general process flow for implementing the vertical CFET with 2D materials can be described below as an example process. The example process may be combined or augmented without departing from the scope of this disclosure.

The techniques provided herein can utilize conductive dielectric materials (sometimes referred to herein as "conductive channels"), which may have similar properties to semiconductor materials, to fabricate vertical 3D transistors. For example, certain materials, when combined with oxygen, may form new materials that exhibit semiconductor properties (e.g., it can turn "off" with low off-state leakage current, or can become highly conductive under certain circumstances, etc.). Some examples of N-type conductive channels include $In_2O_3$, $SnO_2$, InGaZnO, and ZnO. One example of a P-type conductive channel is SnO.

Additionally, the channel can include multiple 2D materials. The 2D materials can form on a sidewall (sometimes referred to as the inner surface or canal) of the channel (e.g., deposited on oxide). Some examples of the 2D materials for use in forming the channel include, but are not limited to, $LaAlO_3$, $SrTiO_3$, n-aluminum gallium arsenide (n-AlGaAs), i-gallium arsenide (i-GaAs), semi-gallium arsenide (SI—GaAs), graphene, transition metal dichalcogenides (TMDs), $WS_2$, $WSe_2$, $WTe_2$, $MoS_2$, $MoSe_2$, $MoTe_2$, $HfS_2$, $ZrS_2$, $TiS_2$, GaSe, InSe, phosphorene, among others. These materials may be deposited by an atomic layer deposition (ALD) process and may be, for example, 5-15 angstroms thick, the thinness lending to their name—2D material. The materials may be annealed during or after the device formation process to recrystallize or grow the crystals and thereby improve electrical characteristics. Certain 2D materials (e.g., a combination of two or more 2D materials interfacing or in contact with each other) can be used herein as examples. The combination of 2D materials can be predetermined to form/create/generate a quantum well (e.g., a 2D gas channel, 2D layer, trench, among other similar terms) in response to an interface between the materials. In some cases, the 2D materials formed within the channel may be referred to as a channel structure.

Further, various techniques may be implemented to form the high-k barrier between the channel structure (e.g., at least one of the 2D materials) and the gate electrode. One such technique utilizes a selective deposition of a high-k dielectric to form the transistor gates. In some implementations, a gate-recessing technique is utilized to allow a more uniform layer of doped conductive oxide material to form along the sidewall of the opening. Another similar technique provides a non-selective deposition of the high-k dielectric in the gate-recessed opening in conjunction with self-aligned directional etching. These techniques may also be implemented to fabricate stacked transistors of the same type by utilizing the same conductive oxide for two or more transistor layers. These and other aspects are described in further detail herein.

Reference will now be made to the Figures, which for the convenience of visualizing the 3D fabrication techniques described herein, illustrate a substrate undergoing a process flow in cross-sectional views. Certain Figures can illustrate or present a top view of the substrate undergoing the process flow. Each Figure may represent one (or a set) of fabrication steps in a process flow for manufacturing the devices described herein. In the cross-sectional views of the Figures, connections between conductive layers or materials may be shown. However, it should be understood that these connections between various layers and masks are merely illustrative and are intended to show a capability for providing such connections and should not be considered limiting to the scope of the claims.

Likewise, although the Figures and aspects of the disclosure may show or describe devices herein as having a particular shape, it should be understood that such shapes are merely illustrative and should not be considered limiting to the scope of the techniques described herein. For example, although certain figures show various layers defining transistor structures or other electric structures in a circular configuration, other shapes are also contemplated, and indeed the techniques described herein may be implemented in any shape or geometry. In addition, examples in which two transistors or devices are shown stacked on top of one another are shown for illustrative purposes only, and for the purposes of simplicity. Indeed, the techniques described herein may provide for one to any number N stacked devices. Although the devices fabricated using these techniques are shown as transistors, it should be understood that any type of electric or electronic device may be manufactured using such techniques, including but not limited to transistors, variable resistors, resistors, and capacitors.

FIGS. 1-8 show a process flow for the manufacture of 3D VFET or vertical CFET transistor stacks, or other types of electric or electronic devices, with 2D materials. Each of the FIGS. 1-8 generally refer to one or more process steps in a process flow, each of which are described in detail in connection with the respective Figure. For the purposes of simplicity and ease of visualization, some reference numbers may be omitted from some Figures. As used herein, the terms "first," "second," "third," and "fourth" with respect to particular layers of the stack shown in FIGS. 1-8 refer to the order of the layers relative to substrate 102 (e.g., base substrate), or in some cases the dielectric 112. For example, a "first" layer of a particular type refers to the specified type of layer which is closest to the substrate 102. Likewise, a "second" layer of a particular type refers to the specified type of layer which is second closest to the substrate 102, and so on. In another example, a "first" layer may refer to a layer closest to the dielectric 112. Similarly, the "second" layer may refer to a second closest layer to the dielectric 112, etc.

Referring to FIG. 1, illustrated is a cross-sectional view 100 of a stack of layers of a device with a channel. A substrate 102 can be provided which may be active or passive and may comprise dielectric, conductive, or semiconductive materials or any combination thereof. The substrate 102 may be referred to as a base substrate or its respective material or composition. One or more dielectric layers 104 (e.g., shown as "Dielectric 1" in the legend) may be provided on the substrate 102, among other portions of the VFET structure, to isolate the VFET structure from the underlying substrate (e.g., substrate 102). The dielectric layers 104 may sometimes be referred to as an isolation layer, insulation layer, among other similar terms. The dielectric layers 104 can be formed or composed of any type of dielectric material described herein that is capable of being disposed, patterned, or otherwise provided on the various layers described herein. Some examples of dielectric materials can include, but are not limited to, oxide materials.

The substrate 102 may remain in the final structure or may be removed during or after the formation of the VFET structure. A first dielectric layer 104 (or layers) may be provided or formed on top of the substrate 102. The term source/drain (S/D) will be used to describe layers that may be used as either a source or a drain of a transistor structure. The first S/D layer 106 (e.g., shown as "Metal 1" in the legend) may be formed directly on the substrate 102 or on the one or more dielectric layers 104 described above, such as the first dielectric layer 104. The S/D layers 106 may be any type of conductive metal suitable to form a source or drain electrode in a semiconductor device, including copper, gold, silver, platinum, nickel, tungsten, ruthenium, or other types of conductive metals or alloys. Each S/D layer 106 can be separated by at least one dielectric layer 104 or a portion of the dielectric material. For instance, a second dielectric layer 104 can be formed on the first S/D layer 106 formed/located/positioned on the first dielectric layer 104. Further, herein, certain metals (e.g., S/D layers 106, gate layer 108, or gate layer 110) can be separated from each other by one or more dielectric layers 104, among other dielectric layers. The deposition or addition of layers in the stack may be performed using any type of material deposition technique, including but not limited to ALD, chemical vapor deposition (CVD), and physical vapor deposition (PVD). The techniques for forming these stacked layers is well documented elsewhere and, thus, will not be described in detail herein.

A gate layer 108 (e.g., shown as "Metal 2" in the legend) may then be formed on top of the second layer of the dielectric layer 104 above the first S/D layer 106. A third dielectric layer 104 can be formed on the gate layer 108. Subsequently, a second S/D layer 106 may be formed on the third dielectric layer 104 above the gate layer 108. The gate layer 108 may be a different material than the first and second S/D layers 106. A fourth dielectric layer 104 may then be deposited, formed, or added on top of the second S/D layer 106 to complete/form/compose/structure a first transistor structure. For instance, a collection of at least the first and second S/D layers 106 and the gate layer 108 can form the first transistor structure. As shown in the cross-sectional view 100, a transistor structure can include multiple dielectric layers (with the first transistor having one dielectric layer be the dielectric layer 104, which separates the first transistor structure from the substrate 102) and three conductive metal layers (e.g., the two S/D layers 106 and one gate layer 108).

Subsequent transistor structures may be stacked above the first transistor structure, by depositing similar layers. For instance, above the first transistor structure, a second transistor structure may be formed using one or more of the processes described above. In this case, a fourth dielectric layer 104 can be formed on top of the second S/D layer 106. A third S/D layer 106 can be formed on the fourth dielectric layer 104. A fifth dielectric layer 104 can form on the third S/D layer 106. A gate layer 110 can form on the fifth dielectric layer 104. The gate layer 110 (e.g., a second gate layer) may include or be composed of a different material from the gate layer 108 (e.g., a first gate layer). A sixth dielectric layer 104 can form on the gate layer 110. A fourth S/D layer 106 can form on the gate layer 110. Accordingly, the collection of at least the third and fourth S/D layers 106 and the gate layer 110 can form a second transistor structure.

One or more dielectric layers 104 (e.g., insulation dielectric layers) may be deposited/formed/added/provided between adjacent transistor structures. These layers in the stack of layers may be formed without a mask, such that each layer forms a blanket layer over the prior layer. In some cases, once the layers are formed, each VFET structure or vertical group of VFET structures may be patterned to separate adjacent transistor structure stacks isolated in the x-y plane (e.g., where the x-y plane is perpendicular to the z-direction). The patterning process to separate adjacent transistor structure stacks herein can leverage, include, or utilize any type of patterning process. In some implementations, electrical connections between transistor structures may be formed by patterning the conductive layers described herein, as well as by forming vias to electrically connect different layers. In some other cases, electrical connections between transistor structures may be formed by adding, including, or forming one or more 2D materials between the different layers or from one layer to another. As such, transistor stacks that are isolated in the x-y plane may be electrically connected with one another to form logical or electronic circuits.

As shown in this example process flow, one or more layers of dielectric 104 may be utilized to isolate adjacent transistors from each other (e.g., as shown above, the second S/D layer 106 or below the third S/D layer 106 of a second transistor structure). Once the desired number of transistors stacks have been formed, such as two transistors in this example of a vertical CFET structure, a final/last/top-most dielectric layer 112 (shown as "Dielectric 2" in the table/legend) may be formed. In this case, the dielectric layer 112 can be formed on or above the second transistor structure or on the fourth S/D layer 106 of the second transistor structure.

Different types of gate metals may be used to form different types of transistors, or to form transistors with desired electronic properties. As shown in the cross-sectional view 100, the second transistor structure has a gate layer formed from a layer of metal 110 (shown in the legend as "Metal 3"), different from the first transistor structure which has a gate layer formed from a layer of metal 108 (shown in the legend as "Metal 2"). Different metals may be used to pattern or use different high-k gate dielectrics (e.g., the high-k dielectric 114 or the high-k dielectric 116), which may be suitable for either N-type or P-type vertical transistors. In some implementations, the first transistor structure can include or be composed of the gate layer 108 with a high-k gate dielectric suitable, compatible, or configured for an N-type vertical transistor. The second transistor structure can include or be composed of the gate layer 110 with a high-k gate dielectric suitable, compatible, or configured for a P-type vertical transistor. In some other implementations, the first transistor structure and the second transistor structure can be configured/structured/composed for a P-type vertical transistor or an N-type vertical transistor, respectively.

Once the stack of layers has been constructed using material deposition techniques, the process flow proceeds to the next stage. Either before or after patterning the structures, one or more channels (sometimes referred to as a canal, "transistor body openings", or tunnel of the transistor body) may be formed. To form the channels, a mask (e.g., of a photoresist or other suitable masking material) may be formed over the final dielectric layer 112, with openings that define the x-y cross-section of the channels. The opening that defines the x-y cross-section of the channels can be formed at portion 126 of the device, for example. The opening can be formed as a circle, among other shapes, from the dielectric layer 112 to at least the first S/D layer 106. In this case, the channel can be formed extending from the dielectric layer 112 beyond (e.g., below) the first S/D layer 106, such as to the first dielectric layer 104. As shown in FIG. 1, in this example, the channel may not extend to the substrate 102. In some cases, the channel can extend up to an intermediate (e.g., midsection) of the first dielectric layer 104 or extend from the dielectric layer 112 past the first S/D layer 106. In some other cases, the channel can extend beyond the intermediate of the first dielectric layer 104. One or more etch techniques may be performed to remove the portion of the underlying layers aligned with the opening in the mask to form the transistor body opening. Any type of suitable etching techniques may be used, including but not limited to dry etching, wet etching, or plasma etching techniques. The mask may be removed once the channel openings are defined or may be retained to protect the underlying surface or to remain as part of the final structure.

Figure 2:
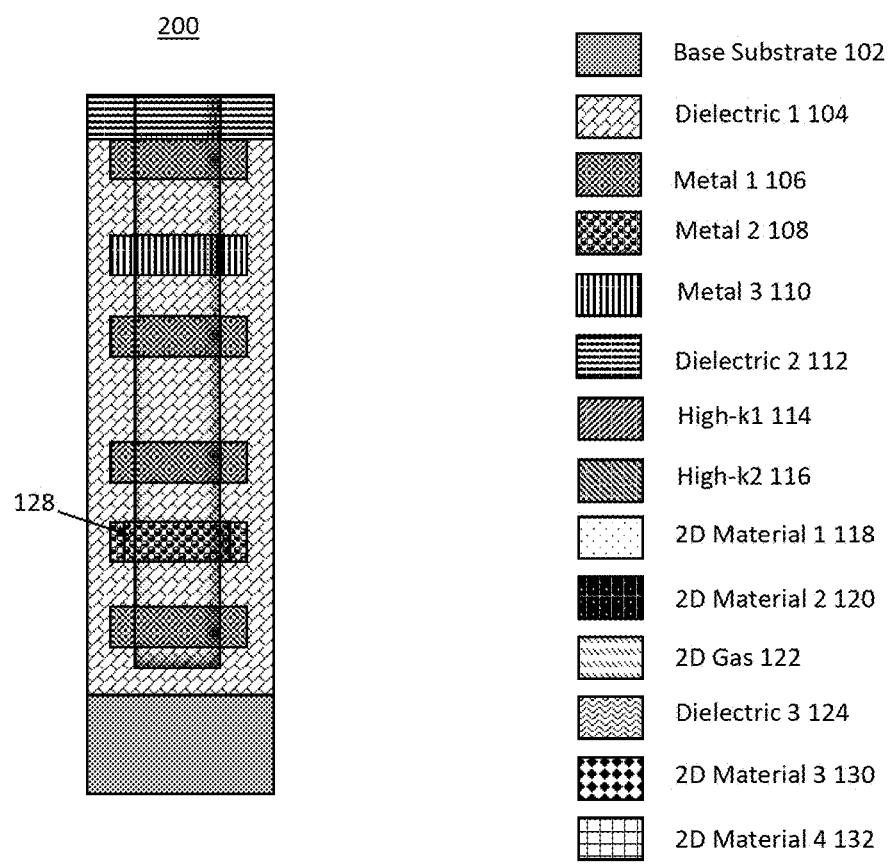

FIG. 2 illustrates a cross-sectional view 200 of a device shown in the next stage of the example process flow. Once the channel opening(s) are defined, one or more of the gate layers 108 may be etched in the x-y direction (e.g., outward from the center of the transistor body opening) to recess the gate from the channel. The etching process may be a selective etching process that etches the gate layers 108 to create recessed regions of a predetermined volume, by etching the gate layers 108 (the gate metal) by a predetermined amount. As shown in FIG. 2, the etching process can be performed at portion 128 of the gate layer 108, in this example.

Figure 3:
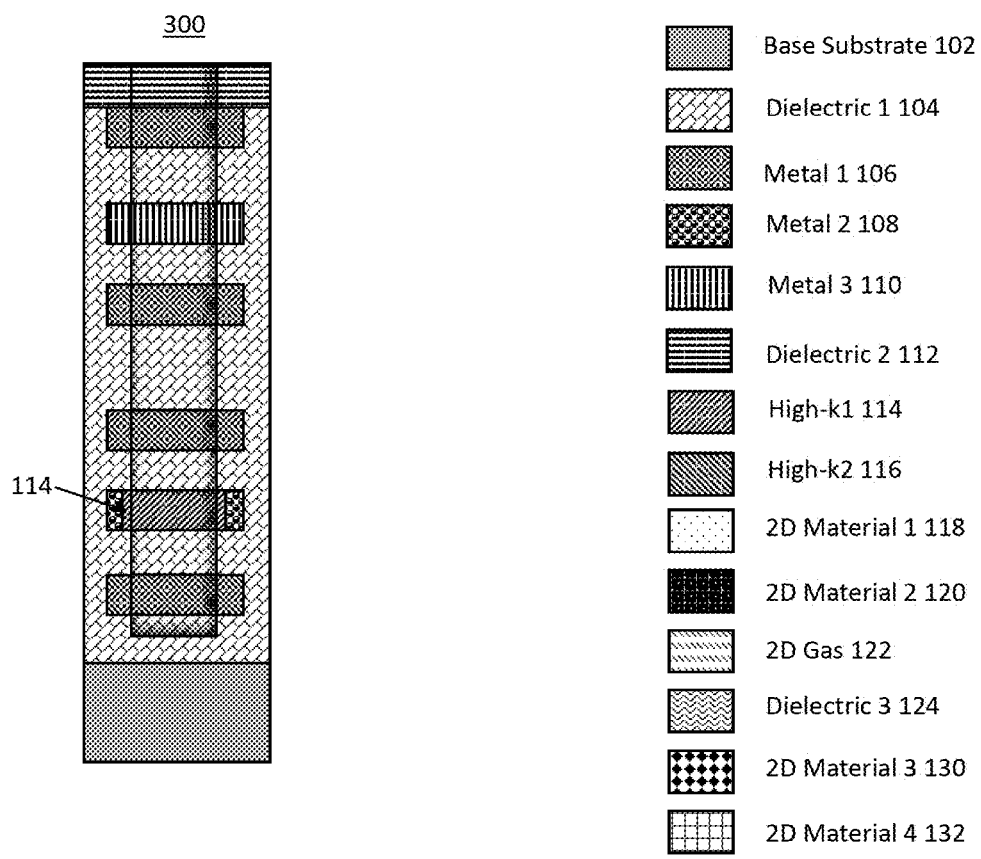

Referring to the next stage of the process flow, FIG. 3 illustrates a cross-sectional view 300 of a device. A gate dielectric, such as a high-k dielectric 114 (e.g., labeled as "High-k1"), may be selectively formed on the gate layer 108. The high-k dielectric 114 can be grown such that a predetermined amount of high-K dielectric 114 fills the recessed region of the gate layers 108. Additionally or alternatively, the high-K dielectric 114 may be formed on recessed or non-recessed gate layer 108 so as to extend into the channel opening. The high-k dielectric 114 material may be selected to have desired attributes or properties, such as a desired dielectric constant. Likewise, the high-k dielectric 114 may be grown to create a predetermined separation distance between the gate layer 108 and the central channel of the transistor structure.

The high-k dielectric 114 and the high-k dielectric 116 can be any type of material that has a relatively large dielectric constant. As one example, a silicon oxide based gate dielectric such as silicon dioxide ($SiO_2$) may be selectively formed on a gate layer of silicon. Additionally or alternatively, other gate dielectric materials may be utilized such as silicon oxynitride ($SiO_xN_y$), silicon nitride ($Si_3N_4$), alumina ($Al_2O_3$), lanthanum oxide ($La_2O_3$), zirconium oxide ($ZrO_2$), hafnium oxide ($HfO_2$), hafnium zirconium oxide (HfZrO), tantalum oxide ($Ta_2O_5$), hafnium silicon oxide ($HfSiO_4$), zirconium silicon oxide ($ZrSiO_4$), titanium oxide ($TiO_2$), strontium titanium oxide ($SrTiO_3$), hafnium silicon oxynitride ($HfSiO_xN_y$), zirconium silicon oxynitride ($ZrSiO_xN_y$), hafnium oxynitride ($HfO_xN_y$), zirconium oxynitride ($ZrO_xN_y$), other suitable materials and combinations thereof. The resulting gate dielectric 114 (e.g., the inner wall or surface facing the center or focus of the transistor body opening) may be formed (or formed and then etched) to be slightly recessed, flush, or slightly protruding relative to the channel opening depending on the desired device characteristics and process parameters.

If multiple devices, such as N-type and P-type devices, are exposed in the opening, suitable dielectrics and thicknesses may be provided to each gate to achieve the desired characteristics. Deposition control may be achieved using specific materials for each gate layer 108 and selecting the gate dielectric 114 to form selectively on that gate layer.

Figure 4:
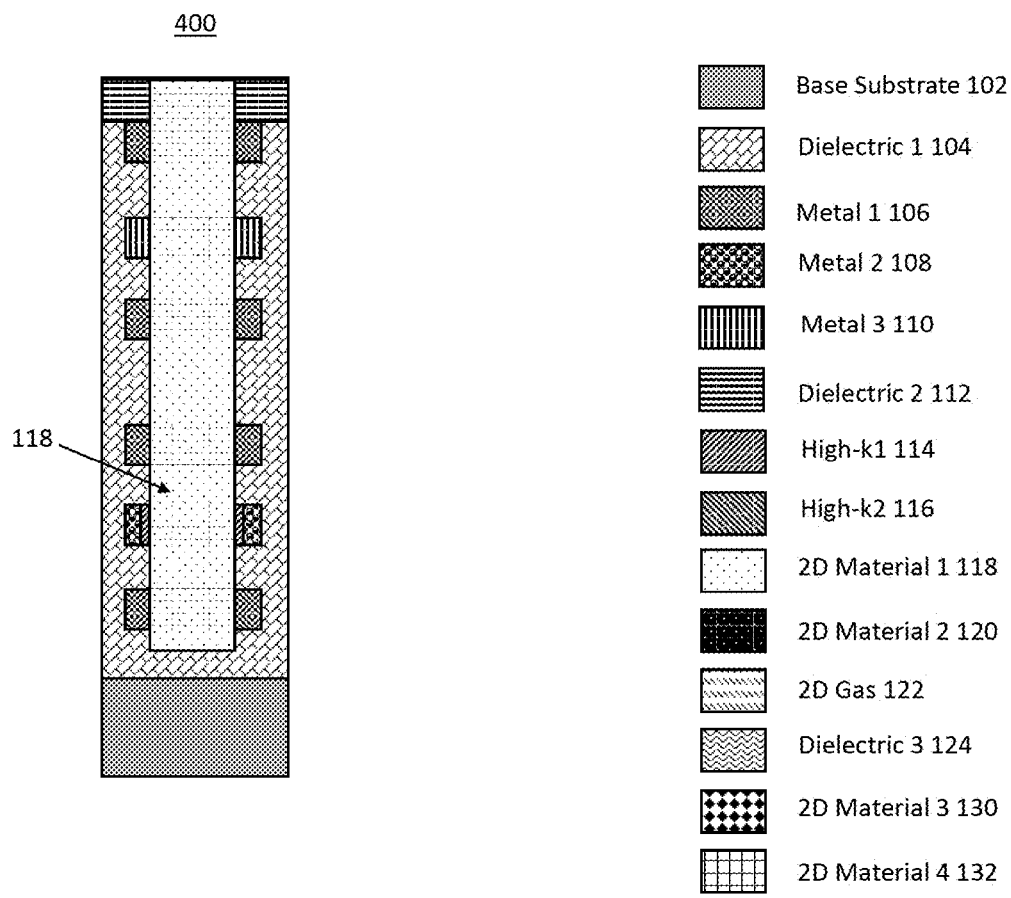

At a next stage of the process flow, FIG. 4 illustrates a cross-sectional view 400 of a device. As shown, a first 2D material 118 (e.g., labeled as "2D Material 1") can be deposited or inserted into the channel (e.g., transistor body opening). The first 2D material 118 can be deposited using any deposition, lining (e.g., forming a liner structure by one or more etching processes after deposition), or filming technique(s). The first 2D material 118 can line, coat, or cover the sidewall, surface, or portions of the channel. The first 2D material 118 can be a sheet, a layer, or a lining of a predetermined thickness or depth forming within the channel. For example, the first 2D material 118, when deposited into the channel, can form a liner or film thereby reducing the overall diameter of the transistor body opening. In this example, the first 2D material 118 can form at least a part/portion of a channel structure (e.g., another channel having a diameter or radius less than the channel formed at the processes described in FIGS. 1-3). Once deposited, the first 2D material 118 can form or be a part of the transistor body opening, the device, or the transistor (e.g., the first transistor in this process).

The deposited first 2D material 118 can extend from the opening, entrance, or top of the channel to the bottom/lowest portion of the channel. In certain cases of this process, the first 2D material 118 may be deposited to extend from the bottom of the channel up to the second S/D layer 106 or the fourth dielectric layer 104, for example. In this example, the deposited first 2D material 118 may not extend above/over/beyond the second S/D layer 106 or the fourth dielectric layer 104. Therefore, when performing one or more etching procedures (e.g., at least FIG. 5), the first 2D material 118 may be maintained at the same vertical height, for example. Otherwise, etching operation(s) can be performed to shorten or reduce the height of the first 2D material 118, among other materials, metals, etc.

After depositing the first 2D material, a second 2D material (e.g., labeled as "2D Material 2") can be deposited. The second 2D material may be thinner, thicker, or the same thickness as the first 2D material. The thickness of the 2D material can be based on the selected material. The second 2D material 120 can be deposited in a similar matter as the first 2D material 118, such as on the sidewalls of the channel. Since the first 2D material 118 is deposited, the second 2D material 120 can be deposited on the sidewalls or surface formed by the first 2D material 118. The second 2D material 120 may extend from the bottom of the channel to a similar height as the deposited first 2D material 118. In some cases, the deposited second 2D material 120 may be higher or lower than the first 2D material 118. The deposited first 2D material 118 and second 2D material 120 can form a whole channel structure or portions of the channel structure. In some cases, additional 2D materials (e.g., third 2D material, fourth 2D material, etc.) may be deposited having similar or varying dimensions including thickness, height/altitude, etc.

The second 2D material 120 can be any material predetermined or preselected to form a quantum well (e.g., a 2D gas layer 122, sometimes referred to as a 2D gas channel) at an interface between the first 2D material 118 and the second 2D material 120, such as when applying voltages. The second 2D material 120 can be based on the selected first 2D material 118. For example, if the first/second 2D material is a crystal substrate (e.g., $SrTiO_3$), the second/first 2D material can be a thin film crystal (e.g., $LaAlO_3$). In another example, if the first/second 2D material is graphene, the second/first 2D material can be TMDs. In some cases, the 2D gas layer 122 may be formed at one or more interfaces between more than two 2D materials. Accordingly, the 2D gas layer 122 can be formed between the interfaced or connected first 2D material 118 and the second 2D material 120. Based on the type of transistor, the 2D gas layer 122 may correspond to 2D electron gas (2DEG) (e.g., for n-type FET or NMOS) or a 2D hole gas (2DHG) (e.g., for p-type FET or PMOS). The second 2D material may be shown or described in at least FIG. 10.

In some implementations, the second 2D material 120 may be deposited before the first 2D material 118. For example, the second 2D material 120 can be deposited into the channel (e.g., similar to the deposition of the first 2D material 118 as shown in conjunction with FIG. 4). In this example, after depositing the second 2D material 120, the first 2D material 118 can be deposited. Accordingly, the transistor body opening can be first (or second) filled with any one of the first 2D material 118 or the second 2D material 120, among other 2D materials to form the 2D gas layer 122. In some cases, one or more etching processes can be performed following the respective deposition of the first 2D material 118 and/or the second 2D material 120. For instance, the process can include depositing and etching the first 2D material 118, and depositing and etching the second 2D material 120, or vice versa. In this case, the etching process for the respective 2D materials may form the opening that defines another x-y cross-section of the channels.

Figure 5:
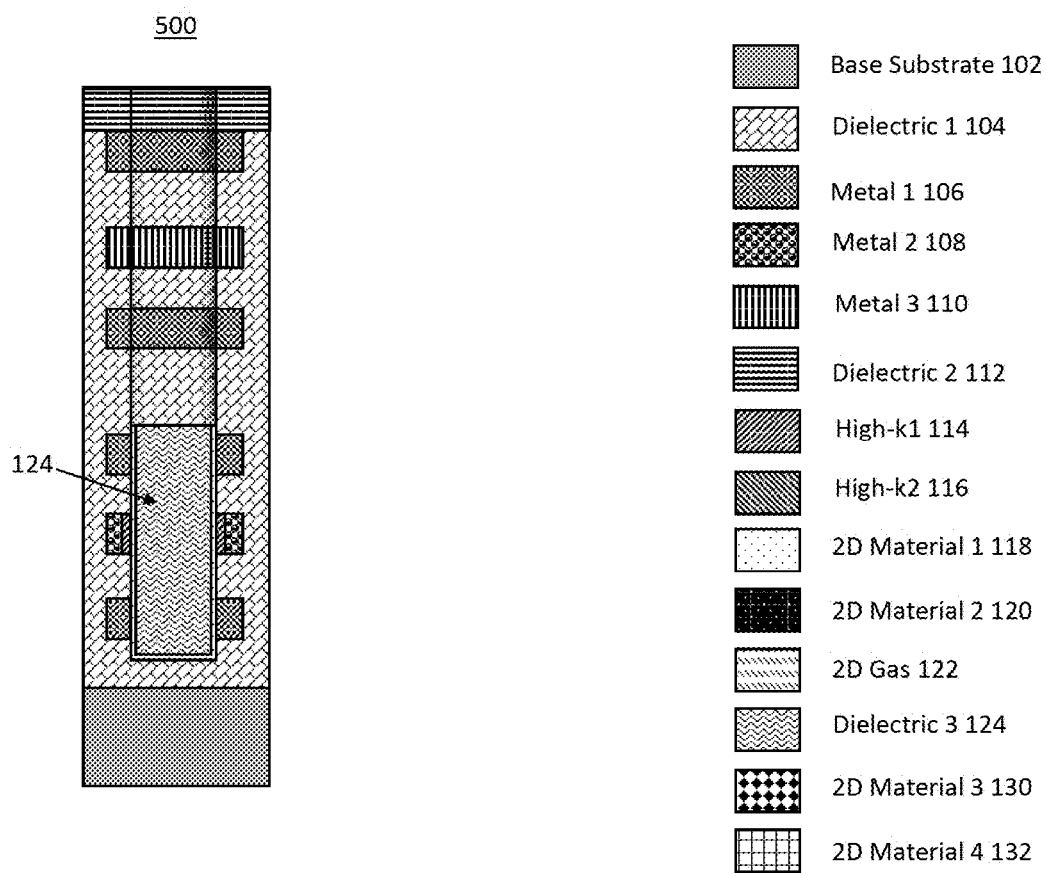

Referring to FIG. 5, in the next stage of the process flow, a cross-sectional view 500 of a device can be shown. Subsequent to/after depositing two or more layers, liners, or films of 2D materials (e.g., upon forming the first 2D material 118 and the second 2D material 120), a first dielectric layer 124 (e.g., labeled as "dielectric 3") can be deposited, inserted, or formed to fill in the channel structure. For instance, the first dielectric layer 124 can fill the lower portion (e.g., at least below the third S/D layer 106) of the transistor body opening via a deposition process. The dielectric 3 may refer to different materials from the dielectric 2 and/or the dielectric 1. The first dielectric layer 124 may be deposited using any suitable deposition technique. The first dielectric layer 124 may include a predetermined type or selection of dielectric material. The first dielectric layer 124 can be deposited to fill the hollow or empty portions of the channel structure surrounded or encircled by layers of 2D materials. In some cases, the first dielectric layer 124 may be filled up to a similar height as one or more of the 2D materials, such as up to the second S/D layer 106. In some other cases, the first dielectric layer 124 may be filled higher or lower than the deposited 2D material(s).

Accordingly, once the 2D materials (e.g., the first 2D material 118 and the second 2D material 120) and the first dielectric layer 124 is situated, deposited, located, or positioned in the channel of the transistor body opening, the channel can be filled (or substantially filled) from the bottom of the channel vertically to at least the second S/D layer 106. In some cases, the 2D materials and the first dielectric layer 124 can be filled up to the dielectric layer 112 of the device (e.g., above the second transistor). As shown, the first S/D layer 106, the second S/D layer 106, and the gate layer 108 can sound respective portions of the channel structure formed by the 2D materials, and the channel structure can surround the first dielectric layer 124. The first dielectric layer 124 in this example (e.g., shown in FIG. 5) may be referred to as a first dielectric core or a first dielectric layer of the device.

Additionally or alternatively, some or all of the core area may be left empty to leave an air gap (not shown). If an air gap is desired, the core area may be sealed at an upper end using a capping material to prevent unwanted debris, liquid, moisture, or other material from entering the gap and potentially affecting the devices.

Subsequent to depositing the first dielectric layer 124, one or more suitable etchants can be utilized to etch or remove at least a portion of the 2D materials and the first dielectric layer 124. This can result in the removal of materials within the channel in the z-direction to lower the height of the first dielectric layer 124. In this example, the materials deposited into the channel can be removed or etched back/down to a portion of the second S/D layer 106. In some cases, the materials in the channel may be etched down to a portion of the fourth dielectric layer 104. In some implementations, in this process, the channel structure may be vertically flush (e.g., in the z-direction) with the first dielectric layer 124. In some other implementations, in this process, the channel structure may be higher or lower in the z-direction compared to the first dielectric layer 124. The channel structure of this process may be referred to as a first channel structure. The first channel structure may exceed up to, without being at, the portion of the channel surrounded by the third S/D layer 106, for example.

Figure 6:
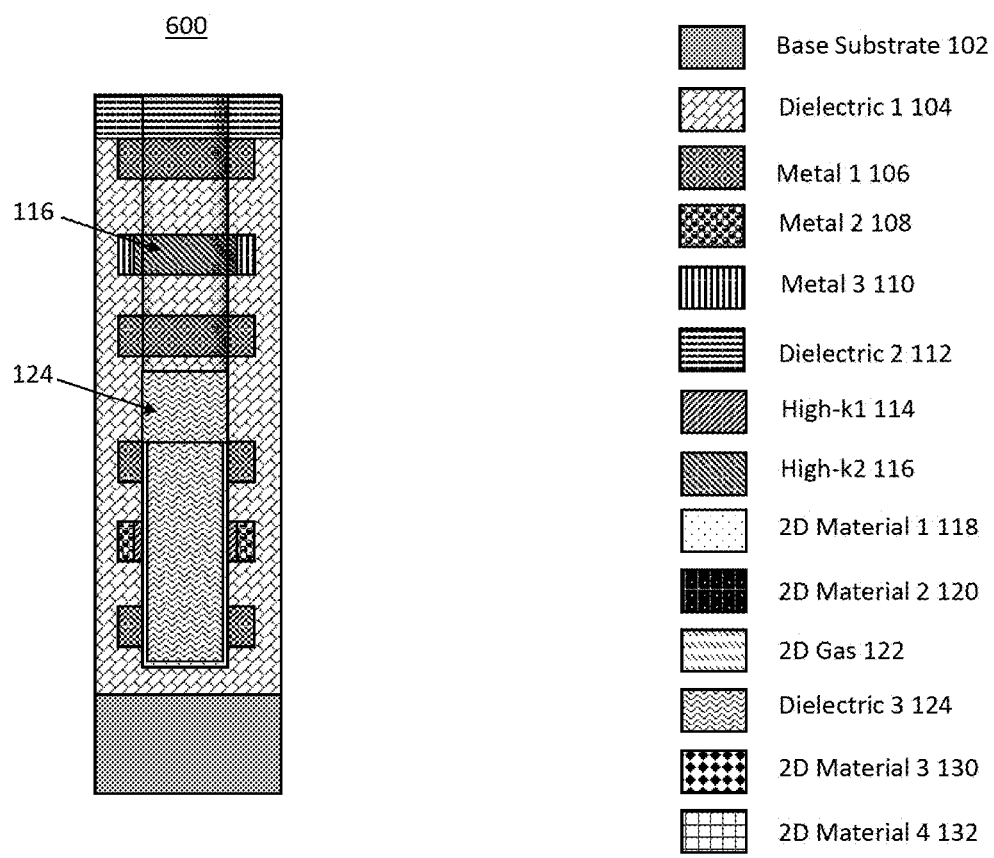

Referring to FIG. 6, as the next process of the process flow, a cross-sectional view 600 of a device can be shown. A second dielectric layer 124 can be deposited into the channel subsequent to or responsive to etching the first channel structure and the first dielectric core. As shown, the second dielectric layer 124 can reside in the channel at a portion surrounded by the fourth dielectric layer 104. The second dielectric layer 124 can fill, cover, or mask the channel opening at this portion. For example, the second dielectric layer 124 can be located between the second S/D layer 106 and the third S/D layer 106. The second dielectric layer 124 may separate the first transistor from the second transistor.

In some implementations, the second dielectric layer 124 may include a similar material as the first dielectric layer 124. In some other implementations, the second dielectric layer 124 may include a different material compared to the first dielectric layer 124. In certain cases, the second dielectric layer 124 may be deposited up to the desired level or height in the channel. In some other cases, the second dielectric layer 124 may fill the remaining or empty portions of the channel, and be etched back to the desired level.

Prior to or after depositing the second dielectric layer 124, another etching process can be performed at a portion of the gate layer 110, for instance, similar to etching the gate layer 108. For example, one or more of the gate layers 110 may be etched in the x-y direction (e.g., outward from the center of the transistor body opening) to recess the gate from the channel. The etching process may be a selective etching process that etches the gate layers 110 to create recessed regions of a predetermined volume, by etching the gate layers 110 (the gate metal) by a predetermined amount. The gate layer 110 may be etched to a similar depth as the gate layer 108. In some cases, the gate layer 110 may be etched more than or less than the gate layer 108.

Another gate dielectric, such as a high-k dielectric 116 (e.g., labeled as "High-k2"), may be selectively formed on the gate layer 110. The high-k dielectric 116 can be grown such that a predetermined amount of high-K dielectric 116 fills the recessed region of the gate layers 110. Additionally or alternatively, the high-K dielectric 116 may be formed on recessed or non-recessed gate layer 110 so as to extend into the channel opening. The high-k dielectric 116 material may be selected to have desired attributes or properties, such as a desired dielectric constant. Likewise, the high-k dielectric 116 may be grown to create a predetermined separation distance between the gate layer 110 and the central channel of the transistor structure.

In some implementations, the high-k dielectric 116 can fill the recessed region of the gate layer 110 in a similar manner as the high-k dielectric 116 filling the recessed region of the gate layer 108, for example. The high-k dielectric 116 can be different from the high-k dielectric 114, such as to support a different type of transistor. For example, the material of the high-k dielectric 114 may be selected to support an N-type device and the high-k dielectric 116 may be selected to support a P-type device or vice versa.

Figure 7:
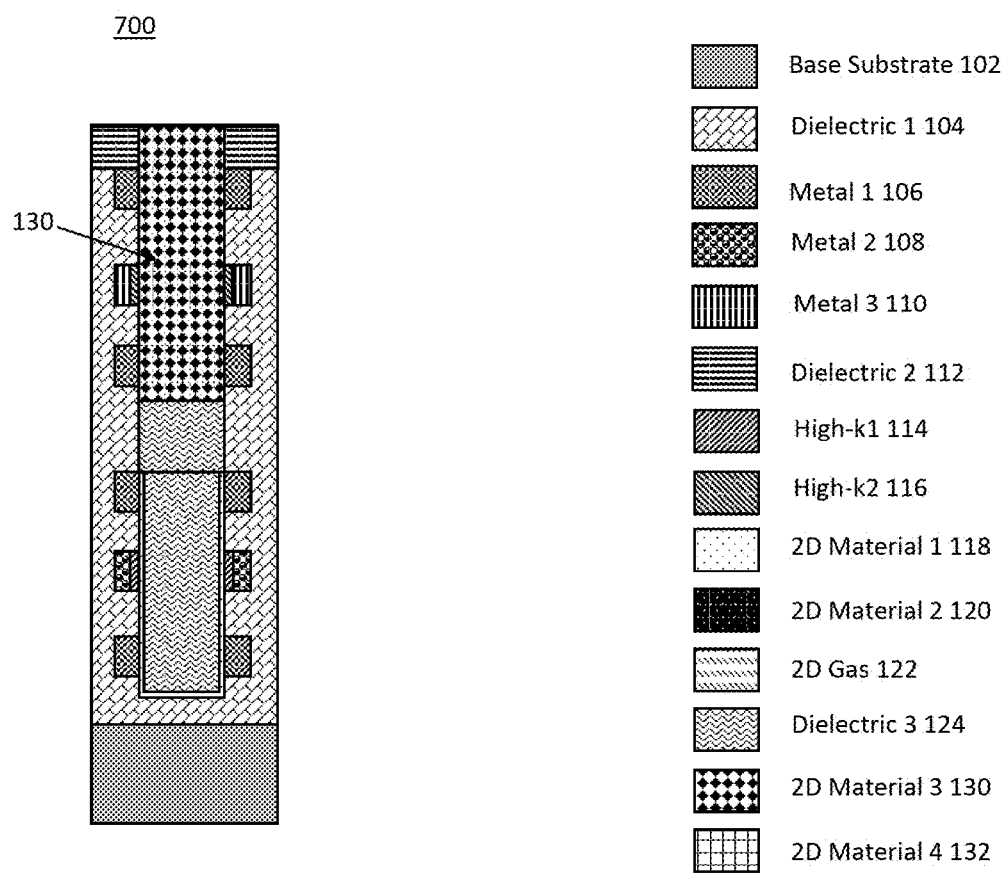

Referring to FIG. 7, in the next stage of the process flow, a cross-sectional view 700 of a device can be shown. A first 2D material 130 (e.g., labeled as "2D material 3") can be deposited or inserted into the channel subsequent to the second dielectric layer 124 and/or growing the high-k dielectric 116. Subsequently, a second 2D material 132 (e.g., labeled as "2D material 4") can be deposited into the channel or overlaying the first 2D material 130, thereby forming a second channel structure. For example, the first 2D material 130 and the second 2D material 132 can form the second channel structure. In some cases, one or more other 2D materials may be deposited over the second 2D material 132. The first 2D material 130 and/or the second 2D material 132 may be deposited in one or more similar manners to depositing the first 2D material 118 and/or the second 2D material 120 of the first channel structure as described in the process flow of FIG. 4.

For example, the second channel structure (e.g., the first 2D material 130 and the second 2D material 132 above the first channel structure) may be deposited on the sidewall of the channel above the first transistor (or above the second dielectric layer 124). The first 2D material 130 and the second 2D material 132 can include a respective predetermined thickness. The thickness of the first 2D material 130 and the second 2D material 132 of the second channel structure can be different from the 2D materials of the first channel structure. The first 2D material 130 and the second 2D material 132 can interface to form a 2D gas layer (e.g., similar to or different from 2D gas layer 122).

In some cases, the first 2D material 130 may sometimes be referred to as a third 2D material associated with the second channel structure, and the second 2D material 132 may sometimes be referred to as a fourth 2D material. The first 2D material 130 and/or the second 2D material 132 may be the same as or different from the first 2D material 118 and/or the second 2D material 120. For example, the 2D materials of the first channel structure may be formed to support or be configured for a first type of transistor (e.g., NMOS or PMOS, respectively), and the 2D materials of the second channel structure may support a second type of transistor (e.g., PMOS or NMOS, respectively).

In a further example, the second channel structure can extend from the top of the second dielectric layer 124 (or at the third S/D layer 106 portion of the channel) to at least the fourth S/D layer 106. In some cases, the second channel structure can extend up to the dielectric layer 112. In some cases, the vertical length or height of the second channel structure can be comparable (e.g., similar height) to the first channel structure. In some other cases, the second channel structure may be shorter or higher compared to the first channel structure.

Similar to the process described in at least FIG. 4, the 2D materials can be preselected or predetermined to form the 2D gas layer 122, such as responsive to applying voltages to the device. In some implementations, the predetermined materials of the 2D materials between the first and second channel structures may be the same. In some other cases, the 2D materials may be different between the first channel structure and the second channel structure.

Figure 8:
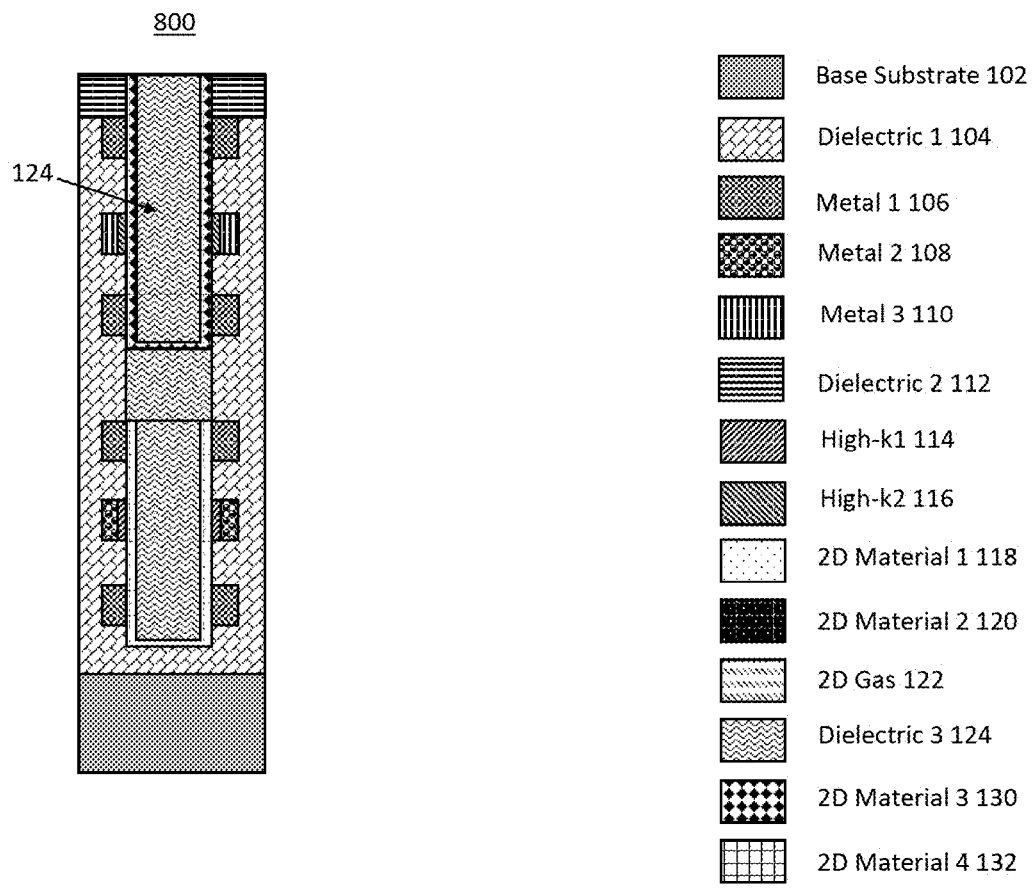

Referring to FIG. 8, in the next stage of the process flow, a cross-sectional view 800 of a device can be shown. Subsequent to depositing two or more layers, liners, or films of 2D materials, a third dielectric layer 124 can be deposited in the channel structure. The first dielectric layer 124 may be deposited using any suitable deposition technique, such as in similar procedures or operations as described in conjunction with FIG. 5. The third dielectric layer 124 may be referred to as a second dielectric core, which can be surrounded by at least the second channel structure, the third S/D layer 106, the fourth S/D layer 106, and the gate layer 110, for example. The third dielectric layer 124 may be the same or different material compared to at least one of the first dielectric layer 124 or the second dielectric layer 124. The third dielectric layer 124 can be deposited to fill the remaining (e.g., hollow or empty) portions of the channel structure surrounded or encircled by layers of 2D materials of the second channel structure. In some cases, the third dielectric layer 124 may be filled up to a similar altitude or height as the second channel structure, such as up to the fourth S/D layer 106 or the dielectric layer 112. In some other cases, the third dielectric layer 124 may be filled higher or lower than the deposited 2D material(s).

Additionally or alternatively, some or all of the core area may be left empty to leave an air gap (not shown). If an air gap is desired, the core area may be sealed at an upper end using a capping material to prevent unwanted debris, liquid, moisture, or other material from entering the gap and potentially affecting the devices. Accordingly, the second transistor can be formed responsive to depositing the third dielectric layer 124. In some implementations, the process to form the second transistor can be similar to the process to form the first transistor of the device. In some implementations, the process flow may be repeated for other portions of the device, such as to form a different vertical CFET, additional transistor(s), or different devices on top of the second transistor, for example.

The stack may be further processed (e.g., using patterning and etching techniques at various stages in the process flows described herein) to provide wiring to gates and S/D regions (not shown). The stack may be bonded to other structures to create electronic or electric circuits, such as other logic circuits, memory circuits, sensors, or other devices. The structures may also be connected to circuits and devices underlying the stack in the base substrate 102, if applicable. Connections may be formed between layers by forming vias and/or traces at appropriate stages in the process flow. This enables complex and dense logical circuits to be created in both the z-direction and the x-y directions.

Figure 9:
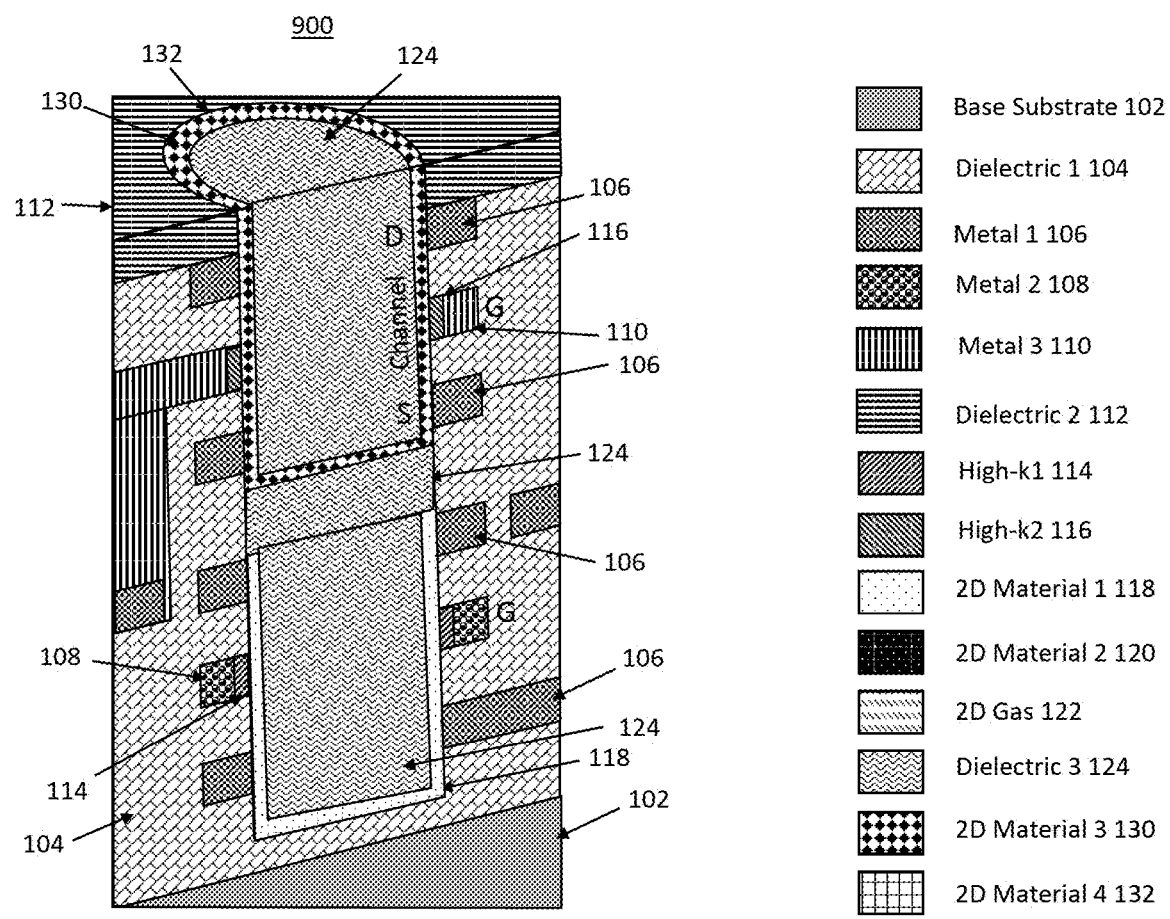
FIG. 9 illustrates a perspective view of the device, according to an embodiment.

Referring now to FIG. 9, depicted is a perspective view 900 of the device. As shown, the process flow described in at least FIGS. 1-8 can form the device (e.g., vertical CFET). In this case, first S/D layer 106 and the third S/D layer 106 can correspond to or be used as the sources of the respective transistors. The second S/D layer 106 and the fourth S/D layer 106 can correspond to the drains of the respective transistors. The deposited 2D materials (e.g., the first channel structure and/or the second channel structure) can form a link, path, channel, or interface between the source and the drain. For example, the first channel structure can form a channel between the first source (e.g., first S/D layer 106) and the first drain (e.g., second S/D layer 106), and the second channel structure can form another channel between the second source (e.g., third S/D layer 106) and the second drain (e.g., fourth S/D layer 106). Accordingly, the first and second channel structures can facilitate electron flows between the drains and sources. Although the transistor body opening may be shown as circular (e.g., top of the perspective view 900), other shapes, dimensions, or patterns can be formed as the transistor body opening to construct the vertical device.

Figure 10:
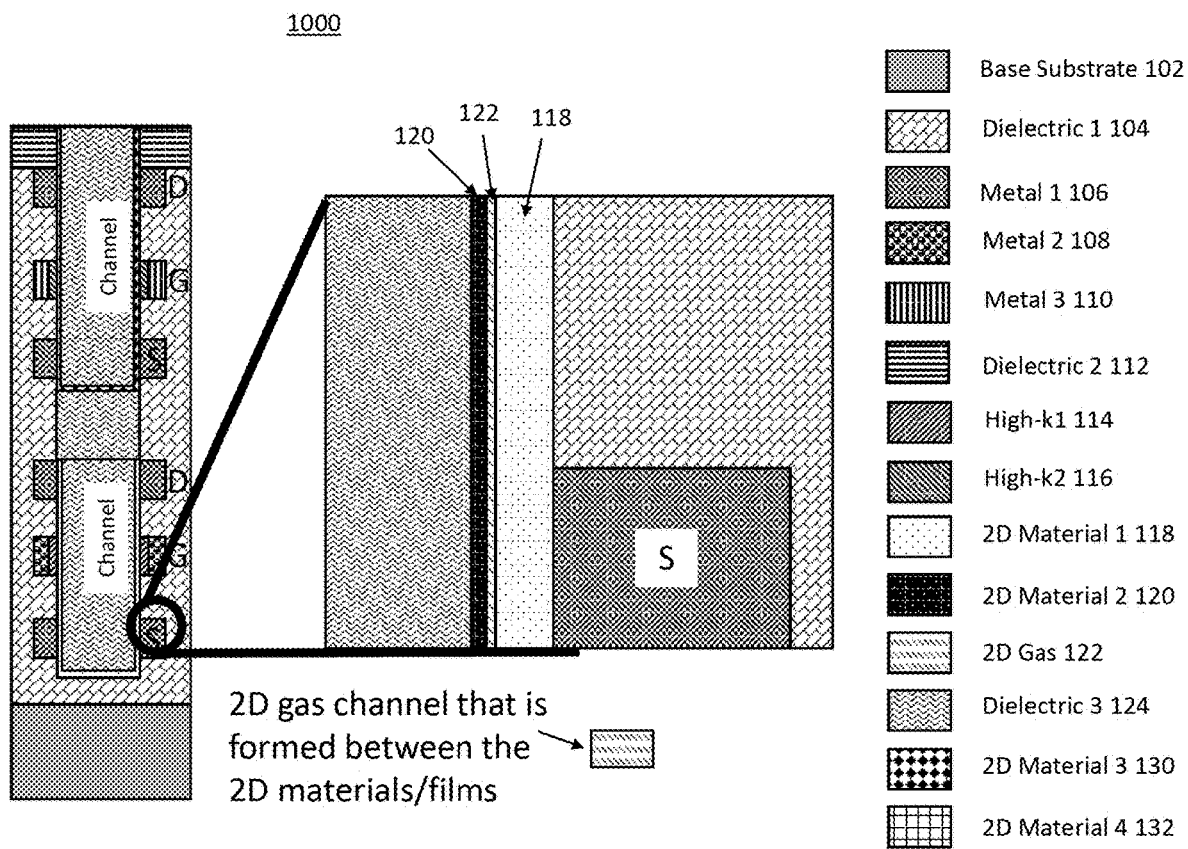
FIG. 10 illustrates a magnified view of 2D materials of the device, according to an embodiment.

FIG. 10 illustrates a magnified view 1000 of 2D materials of the device. As shown, the first 2D material 118 may be deposited into the channel (or the opening of the transistor body), such that the first 2D material 118 is in contact with the sidewall of the channel. By being in contact with the sidewall, the first 2D material 118 can interface with at least one or more dielectric layers 104, one or more S/D layers 106, and/or one or more gate layers 108 or gate layers 110. Subsequently, as shown, the second 2D material 120 may be deposited to interface with the first 2D material 118. In some cases, more than two 2D materials may be deposited. The 2D gas layer 122 (e.g., quantum well) can be formed between the first 2D material 118 and second 2D material 120. Although shown that the first 2D material 118 is thicker than the second 2D material 120, in some cases, the first 2D material 118 may be thinner or of similar thickness compared to the second 2D material 120.

Figure 11:
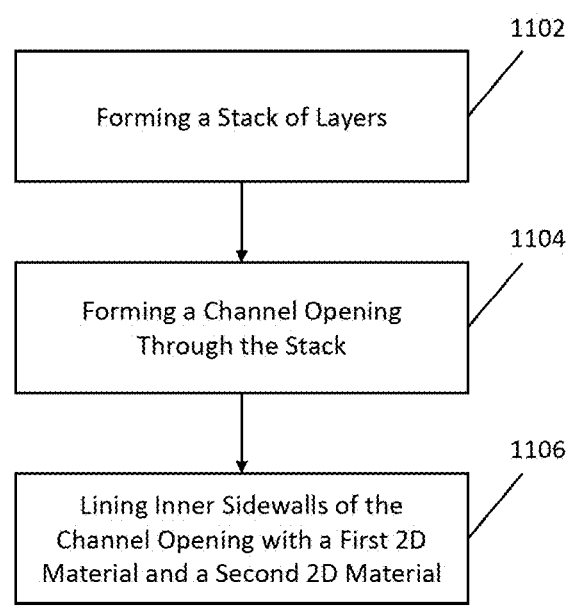
FIG. 11 illustrates a flow diagram of an example method for fabricating a VFET with 2D materials using the process flows described in connection with FIGS. 1-10, according to an embodiment.

FIG. 11 illustrates a flow diagram of a method 1100 for fabricating a VFET with 2D materials using the process flows described in connection with FIGS. 1-10. The method 1100 may include steps 1102-1106. However, other embodiments may include additional or alternative steps, or may omit one or more steps altogether. The method 1100 can include or describe one or more materials, components, objects, layers, compositions, or structures in conjunction with FIGS. 1-10.

At step 1102, the method 1100 can include forming a stack of layers. The stack of layers may include one or more transistor structures. For example, the stack of layers can include at least a first metal layer, a second metal layer, and a third metal layer. These metal layers can be isolated from one another with at least one dielectric material (e.g., one or more dielectric layers 104). Each of the first metal layer, the second metal layer, and the third metal layer can correspond to one of a source metal, a drain metal, or a gate metal. For example, the first metal layer, the second metal layer, and the third metal layer may correspond to a first source metal (e.g., first S/D layer 106), a first drain metal (e.g., second S/D layer 106), and a first gate metal (e.g., gate layer 108), respectively.

The first layer stack may be associated with a first transistor structure (e.g., two S/D layers 106 with a gate layer 108 or 110 positioned in-between). The stack of layers may be formed to include multiple transistors structures. For example, the stack of layers may include a second layer stack including at least three layers of at least one conductive material (e.g., other two S/D metal layers 106 and the gate layer 108 or 110 positioned in-between) separated by one or more layers of at least one dielectric material (e.g., the dielectric layers 104). The metals and the dielectric material(s) separating the metals can be positioned above a substrate (e.g., base substrate 102). Further, the dielectric layer 112, among other materials, can be positioned above the transistors. For example, with a two-transistors configuration, the dielectric layer 112 can be positioned above the second transistor or the top-most metal layer in this example. The second layer stack may be associated with a second transistor structure. Additional transistor structures may also be formed using similar techniques. The first and second transistor structures may be separated by one or more dielectric materials (e.g., the dielectric materials 124 or the second dielectric layer 124). The stack of layers may be formed using techniques similar to those described in connection with at least FIG. 1.

At step 1104, the method 1100 can include forming a channel opening in/through the stack. The channel opening (sometimes referred to as the "transistor body opening") may be formed using any type of suitable etching technique, similar to the techniques described in connection with at least FIG. 1. The transistor body opening may extend through each of the transistor structures in the stack of layers. After defining the channel opening, high-k gate dielectrics (e.g., the gate dielectrics or high-k dielectrics 114 or 116) may be deposited on one or more of the gate layers (e.g., the gate layers 108 and/or 110) in each transistor structure in the stack of layers. To do so, one or more of the gate layers may be recessed using techniques similar to those described in conjunction with at least FIG. 2 or 6, and the high-k gate dielectric materials may be subsequently deposited using techniques similar to those described in connection with at least FIG. 3 or 6.

In some cases, the high-k gate dielectrics may be deposited at one of the recessed gate layers after one or more subsequent processes, such as an etching process. For example, a first high-k gate dielectric (e.g., high-k dielectric 114) may be formed or deposited into the recessed region of a first gate layer (e.g., gate layer 108). Subsequent to depositing other materials to form the first transistor and etching the materials in preparation for forming the second transistor (e.g., preparing to deposit 2D materials), the second gate layer (e.g., gate layer 110) may be etched or recessed. In this case, the second high-k gate dielectric (e.g., high-k dielectric 116) may be deposited in the recessed region, area, or portion of the second gate layer. Other materials can be deposited subsequently to form the high-k gate dielectric, such as to structure the second transistor, for example.

The high-k gate dielectrics (e.g., the first high-k gate dielectric and the second high-k gate dielectric, among others) may be positioned or interposed between different materials. For example, the first high-k gate dielectric may be interposed between a first gate metal (e.g., gate layer 108) and one of the 2D materials (e.g., a first 2D material or a second 2D material of the first transistor structure) deposited to the sidewalls of the channel (e.g., in subsequent process flow). Similarly, the second high-k gate dielectric may be interposed between a second gate metal (e.g., gate layer 110) and one of the 2D materials (e.g., a third 2D material or a fourth 2D material of the second transistor structure). The first high-k gate dielectric may be different from the second high-k gate dielectric to support, conform, or be configured for different types of transistors (e.g., N-type or P-type).

At step 1106, the method 1100 can include lining at least the inner sidewalls of the channel opening (e.g., transistor body opening) with a first 2D material and a second 2D material. The first 2D material can interface with the second 2D material. The first 2D material and/or second 2D material can be coupled to the respective inner sidewalls of the first metal layer, the second metal layer, and the third metal layer.

The lining of the sidewalls of the channel may include depositing or inserting the materials into or through the channel. Lining the inner sidewalls can form a first channel structure within the channel opening.

For example, the first channel structure can be aligned with or positioned against the first transistor structure (e.g., the first, second, and third metals). The first channel structure may be deposited using techniques similar to those described in connection with FIG. 4 or 7. By forming the first channel structure, the first source metal, the first drain metal, and the first gate metal can surround or encircle different portions of the first channel structure. For instance, the first source metal can surround a first portion, the first drain metal can surround a second portion of the first channel structure, and the first gate metal can surround a third portion of the first channel structure. In this case, the third portion can be in between the first portion and the second portion of the first channel structure. The first high-k gate dielectric can be interposed between the third portion of the first channel structure and the first gate metal.

Subsequent to depositing the first and second 2D materials to form the first channel structure, dielectric materials forming a first dielectric core (e.g., first dielectric layer 124) can be deposited into the first channel structure. The first dielectric core can be deposited in the channel opening lined with the first 2D material and the second 2D material. Accordingly, the first channel structure can extend along a portion of a sidewall of the channel and a bottom surface of the first dielectric core, such as described or shown in conjunction with at least FIGS. 5-10. In this case, the portion of the sidewall corresponding to the first channel structure may extend from at least the first portion to the third portion of the first channel structure. Further, the first channel structure may wrap or encapsulate the bottom of the first dielectric core.

After depositing the 2D materials and the first dielectric core to form the first transistor structure, etching can be performed to remove materials from the channel, such as down to the top of or above the second portion of the first channel structure. Dielectric materials (e.g., dielectric materials 124) can be deposited above the first transistor structure (e.g., above the second portion of the first channel structure). These dielectric materials can separate between the first and second transistor structures. In some cases, the dielectric materials can be etched back below or at the bottom of the second transistor structure, such as shown in conjunction with at least FIGS. 7-10.

One or more processes can be repeated to form one or more additional transistors. For example, a third 2D material and a fourth 2D material can be deposited, lining different portions of the inner sidewalls of the channel opening. The third 2D material and/or fourth 2D material can be coupled to the respective inner sidewalls of a fourth metal layer, a fifth metal layer, and a sixth metal layer associated with the second transistor structure. In this case, the fourth metal layer, fifth metal layer, and sixth metal layer may refer to or correspond to a second source metal (e.g., third S/D layer 106), a second drain metal (e.g., fourth S/D layer 106), and a second gate layer (e.g., gate layer 110), respectively. In this case, lining the inner sidewalls (e.g., the third and fourth 2D materials) can form a second channel structure within the channel opening. The first channel structure and the second channel structure may be separated by dielectric materials (e.g., dielectric material 124). Further, the second source metal can surround a first portion of the second channel structure, the second drain metal can surround a second portion of the second channel structure, and the second gate metal can surround a third portion of the second channel structure. In this case, the third portion can be in between the first portion and the second portion of the second channel structure. The second high-k gate dielectric can be interposed between the third portion of the second channel structure and the second gate metal.

Upon forming the second channel structure, dielectric materials (e.g., third dielectric layer 124) forming a second dielectric core can be deposited into the second channel structure. The second channel structure can surround the second dielectric core which can extend in the channel opening lined with the third 2D material and the fourth 2D material. The second dielectric core can be disposed above the first dielectric core. Accordingly, the second channel structure can extend along another portion of the sidewall (e.g., at least from the first portion to the second portion of the second channel structure) of the channel and a bottom surface of the second dielectric core, such as described or shown in conjunction with at least FIGS. 7-10. In this case, the second channel structure may extend past or beyond the second portion of the channel structure, such as to the final dielectric layer (e.g., dielectric layer 112) of the transistors, for example.

The first channel structure (e.g., first and second 2D materials) and the second channel structure (e.g., third and fourth 2D materials) can each form a 2D gas at an interface between at least the respective two 2D materials. For instance, a first 2D gas can form between the first and second 2D materials and a second 2D gas can form between the third and fourth 2D materials. The 2D gas can extend along the vertical direction (e.g., z-direction) from the respective source metal to the drain metal. In this case, the first 2D gas can extend from the first source metal to the first drain metal, and the second 2D gas can extend from the second source metal to the second drain metal.

In some implementations, at least one of the third 2D material or the fourth 2D material may be different from at least one of the first 2D material or the second 2D material. For instance, different 2D materials can be used to form the 2D gas. The first and second 2D materials may be preselected to utilize a first set of 2D materials, and the third and fourth 2D materials may be preselected to utilize a second set of 2D materials to form the respective 2D gas. In some other cases, the first and second 2D materials can be the same as the third and fourth 2D materials.

Accordingly, the first channel structure, the first source metal, the first drain metal, and the first gate metal can collectively form the first transistor. The first transistor can include or have a first conductive type (e.g., N-type or P-type). Further, and collectively, the second channel structure, the second source metal, the second drain metal, and the second gate metal can form the second transistor. The second transistor can have a second conductive type opposite to the first conductive type.

Having now described some illustrative implementations, it is apparent that the foregoing is illustrative and not limiting, having been presented by way of example. In particular, although many of the examples presented herein involve specific combinations of method acts or system elements, those acts and those elements may be combined in other ways to accomplish the same objectives. Acts, elements and features discussed only in connection with one implementation are not intended to be excluded from a similar role in other implementations or implementations.

The phraseology and terminology used herein is for the purpose of description and should not be regarded as limiting. The use of "including" "comprising" "having" "containing" "involving" "characterized by" "characterized in that" and variations thereof herein, is meant to encompass the items listed thereafter, equivalents thereof, and additional items, as well as alternate implementations consisting of the items listed thereafter exclusively. In one implementation, the systems and methods described herein consist of one, each combination of more than one, or all of the described elements, acts, or components.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Any references to implementations or elements or acts of the systems and methods herein referred to in the singular may also embrace implementations including a plurality of these elements, and any references in plural to any implementation or element or act herein may also embrace implementations including only a single element. References in the singular or plural form are not intended to limit the presently disclosed systems or methods, their components, acts, or elements to single or plural configurations. References to any act or element being based on any information, act or element may include implementations where the act or element is based at least in part on any information, act, or element.

Any implementation disclosed herein may be combined with any other implementation, and references to "an implementation," "some implementations," "an alternate implementation," "various implementation," "one implementation" or the like are not necessarily mutually exclusive and are intended to indicate that a particular feature, structure, or characteristic described in connection with the implementation may be included in at least one implementation. Such terms as used herein are not necessarily all referring to the same implementation. Any implementation may be combined with any other implementation, inclusively or exclusively, in any manner consistent with the aspects and implementations disclosed herein.

References to "or" may be construed as inclusive so that any terms described using "or" may indicate any of a single, more than one, and all of the described terms.

Where technical features in the drawings, detailed description or any claim are followed by reference signs, the reference signs have been included for the sole purpose of increasing the intelligibility of the drawings, detailed description, and claims. Accordingly, neither the reference signs nor their absence have any limiting effect on the scope of any claim elements.

The preceding description of the disclosed embodiments is provided to enable any person skilled in the art to make or use the embodiments described herein and variations thereof. Various modifications to these embodiments will be readily apparent to those skilled in the art, and the principles defined herein may be applied to other embodiments without departing from the spirit or scope of the subject matter disclosed herein. Thus, the present disclosure is not intended to be limited to the embodiments shown herein but is to be accorded the widest scope consistent with the following claims and the principles and novel features disclosed herein.

While various aspects and embodiments have been disclosed, other aspects and embodiments are contemplated. The various aspects and embodiments disclosed are for purposes of illustration and are not intended to be limiting, with the true scope and spirit being indicated by the following claims.

What is claimed is:

1. A semiconductor device, comprising:
    a channel structure surrounding a dielectric core, the channel structure comprising a first two-dimensional (2D) material and a second 2D material;
    a source metal surrounding a first portion of the channel structure;
    a drain metal surrounding a second portion of the channel structure; and
    a gate metal surrounding a third portion of the channel structure.

2. The semiconductor device of claim 1, wherein the channel structure comprises a 2D gas formed at an interface between the first 2D material and the second 2D material.

3. The semiconductor device of claim 2, wherein the 2D gas extends from the source metal to the drain metal.

4. The semiconductor device of claim 1, wherein the channel structure extends along a portion of a sidewall and a bottom surface of the dielectric core.

5. The semiconductor device of claim 1, further comprising a high-k gate dielectric interposed between the third portion of the first channel structure and the gate metal.

6. The semiconductor device of claim 1, further comprising:
    a second channel structure surrounding a second dielectric core that is disposed above the first dielectric core, the second channel structure comprising a third 2D material and a fourth 2D material;
    a second source metal surrounding a first portion of the second channel structure;
    a second drain metal surrounding a second portion of the second channel structure; and
    a second gate metal surrounding a third portion of the second channel structure.

7. The semiconductor device of claim 6, wherein at least one of the third 2D material or the fourth 2D material is different from at least one of the first 2D material or the second 2D material.

8. The semiconductor device of claim 6, wherein at least one of the third 2D material or the fourth 2D material is the same material as at least one of the first 2D material or the second 2D material.

9. The semiconductor device of claim 6, wherein the channel structure, the source metal, the drain metal, and the gate metal collectively form a first transistor having a first conductive type, and
    the second channel structure, the second source metal, the second drain metal, and the second gate metal collectively form a second transistor having a second conductive type opposite to the first conductive type.

10. A semiconductor device, comprising:
    a first transistor structure comprising:
        a first channel structure surrounding a first dielectric core in a channel opening, the first channel structure comprising a first two-dimensional (2D) material and a second 2D material;
        a first source metal surrounding a first portion of the first channel structure;

a first drain metal surrounding a second portion of the first channel structure;

a first gate metal surrounding a third portion of the first channel structure; and a second transistor structure disposed above the first transistor and comprising:

a second channel structure surrounding a second dielectric core disposed above the first dielectric core in the channel opening, the second channel structure comprising a third 2D material and a fourth 2D material;

a second source metal surrounding a first portion of the second channel structure;

a second drain metal surrounding a second portion of the second channel structure;

a second gate metal surrounding a third portion of the second channel structure.

11. The semiconductor device of claim 10, wherein the first channel structure comprises a first 2D gas formed at an interface between the first 2D material and the second 2D material, and wherein the second channel structure comprises a second 2D gas formed at an interface between the third 2D material and the fourth 2D material.

12. The semiconductor device of claim 11, wherein the first 2D gas extends along the vertical direction from the first source metal to the first drain metal, and wherein the second 2D gas extends from the second source metal to the second drain metal.

13. The semiconductor device of claim 11, wherein the first channel structure extends along a first portion of a sidewall and a bottom surface of the first dielectric core.

14. The semiconductor device of claim 13, wherein the second channel structure extends along a second portion of the sidewall, a bottom surface of the second dielectric core, and a top surface of the first dielectric core.

15. The semiconductor device of claim 11, further comprising a first high-k gate dielectric interposed between the third portion of the first channel structure and the first gate metal.

16. A method for manufacturing semiconductor devices, comprising:

forming a stack of layers including a first metal layer, a second metal layer, and a third metal layer that are isolated from one another with at least one dielectric material;

forming a channel opening through the stack; and lining at least inner sidewalls of the channel opening with a first two-dimensional (2D) material and a second 2D material, wherein the first 2D material is coupled to respective inner sidewalls of the first metal layer, the second metal layer, and the third metal layer.

17. The method of claim 16, further comprising depositing a first dielectric core that extends in the channel opening lined with the first 2D material and the second 2D material.

18. The method of claim 16, wherein each layer of the first metal layer, the second metal layer, and the third metal layer respectively corresponds to one of a source metal, a drain metal, or a gate metal.

19. The method of claim 18, further comprising forming a high-k gate dielectric interposed between one of the first 2D material or the second 2D material and the gate metal.

20. The method of claim 16, further comprising forming a first 2D gas at an interface between the first 2D material and the second 2D material.

* * * * *